(12) United States Patent
Sun et al.

(10) Patent No.: US 10,276,582 B2
(45) Date of Patent: Apr. 30, 2019

(54) HIGH COUPLING RATIO SPLIT GATE MEMORY CELL

(71) Applicant: GLOBALFOUNDRIES Singapore Pte. Ltd., Singapore (SG)

(72) Inventors: Yuan Sun, Singapore (SG); Shyue Seng Tan, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/681,442

(22) Filed: Aug. 21, 2017

(65) Prior Publication Data

US 2019/0057970 A1    Feb. 21, 2019

(51) Int. Cl.
| | | |
|---|---|---|
| *G11C 16/10* | (2006.01) | |
| *H01L 27/1156* | (2017.01) | |
| *H01L 27/11558* | (2017.01) | |
| *G11C 16/04* | (2006.01) | |
| *H01L 21/28* | (2006.01) | |
| *H01L 29/423* | (2006.01) | |

(52) U.S. Cl.
CPC ...... *H01L 27/1156* (2013.01); *G11C 16/0408* (2013.01); *G11C 16/10* (2013.01); *H01L 21/28273* (2013.01); *H01L 27/11558* (2013.01); *H01L 29/42324* (2013.01)

(58) Field of Classification Search
CPC .................................. G11C 16/10; G11C 16/26
USPC ........................................ 365/185.26, 185.24
See application file for complete search history.

(56) References Cited

U.S. PATENT DOCUMENTS

| | | | | |
|---|---|---|---|---|
| 5,677,867 A | * | 10/1997 | Hazani | G11C 11/5621 257/E21.682 |
| 5,818,761 A | * | 10/1998 | Onakado | G11C 16/0416 365/185.18 |
| 6,201,732 B1 | * | 3/2001 | Caywood | G11C 16/0433 257/E27.103 |
| 6,214,741 B1 | | 4/2001 | Lee | |
| 6,215,145 B1 | | 4/2001 | Noble | |
| 6,271,088 B1 | | 8/2001 | Liu et al. | |
| 6,614,070 B1 | * | 9/2003 | Hirose | G11C 16/26 257/316 |

(Continued)

*Primary Examiner* — Michael T Tran
(74) *Attorney, Agent, or Firm* — Thompson Hine LLP

(57) ABSTRACT

A split gate non-volatile memory (NVM) cell formed on a crystalline-on-insulator (COI) substrate, such as a fully or partially depleted silicon-on-insulator (SOI) substrate is disclosed. The split gate memory cell includes a split gate disposed on a surface substrate of the SOI substrate between source/drain (S/D) regions. The split gate includes a storage gate with a control gate (CG) over a floating gate (FG), and a select gate (SG). A back gate is provided on the bulk substrate below a buried oxide (BOX). The back gate may be doped with the same polarity type dopants as the S/D regions. The back gate is coupled to the CG to increase CG coupling ratio, improving programming performance. Alternatively, the back gate may be doped with the opposite polarity type dopants as the S/D regions. The back gate is coupled to a negative bias during program and erase operations. The negative bias increases the gate threshold voltages of the SG and CG, resulting in higher electron generation efficiency to improve programming speed as well as a higher electric field to increase erase speed.

23 Claims, 13 Drawing Sheets

(56) References Cited

U.S. PATENT DOCUMENTS

| | | | | |
|---|---|---|---|---|
| 7,157,782 B1* | 1/2007 | Shih | H01L 27/0203 | 257/50 |
| 2003/0038318 A1* | 2/2003 | Forbes | G11C 16/0408 | 257/331 |
| 2004/0027907 A1* | 2/2004 | Ooishi | G11C 11/15 | 365/226 |
| 2007/0164352 A1* | 7/2007 | Padilla | G11C 11/5671 | 257/324 |
| 2008/0232183 A1* | 9/2008 | Maejima | H01L 27/0203 | 365/205 |
| 2009/0161439 A1* | 6/2009 | Aiika | G11C 16/0483 | 365/185.23 |
| 2009/0168542 A1* | 7/2009 | Hamada | G11C 16/34 | 365/185.25 |
| 2012/0243335 A1* | 9/2012 | Torii | G11C 16/0416 | 365/185.25 |
| 2013/0214415 A1* | 8/2013 | Pachamuthu | H01L 21/7682 | 257/751 |
| 2014/0159114 A1* | 6/2014 | Zheng | H01L 29/66833 | 257/192 |
| 2014/0241055 A1* | 8/2014 | Backhausen | G11C 16/10 | 365/185.03 |
| 2016/0020219 A1 | 1/2016 | Chuang et al. | | |
| 2016/0035741 A1* | 2/2016 | Tajima | H01L 27/11582 | 257/324 |
| 2016/0071598 A1* | 3/2016 | La Rosa | G11C 16/0433 | 365/185.05 |
| 2016/0099066 A1* | 4/2016 | Dunga | G11C 16/24 | 365/185.17 |
| 2016/0118131 A1* | 4/2016 | Dong | G11C 16/3427 | 365/185.02 |
| 2017/0117291 A1* | 4/2017 | Or-Bach | H01L 23/5283 | |
| 2017/0358362 A1* | 12/2017 | Lee | G11C 16/0466 | |
| 2018/0082749 A1* | 3/2018 | Song | G11C 16/12 | |

* cited by examiner

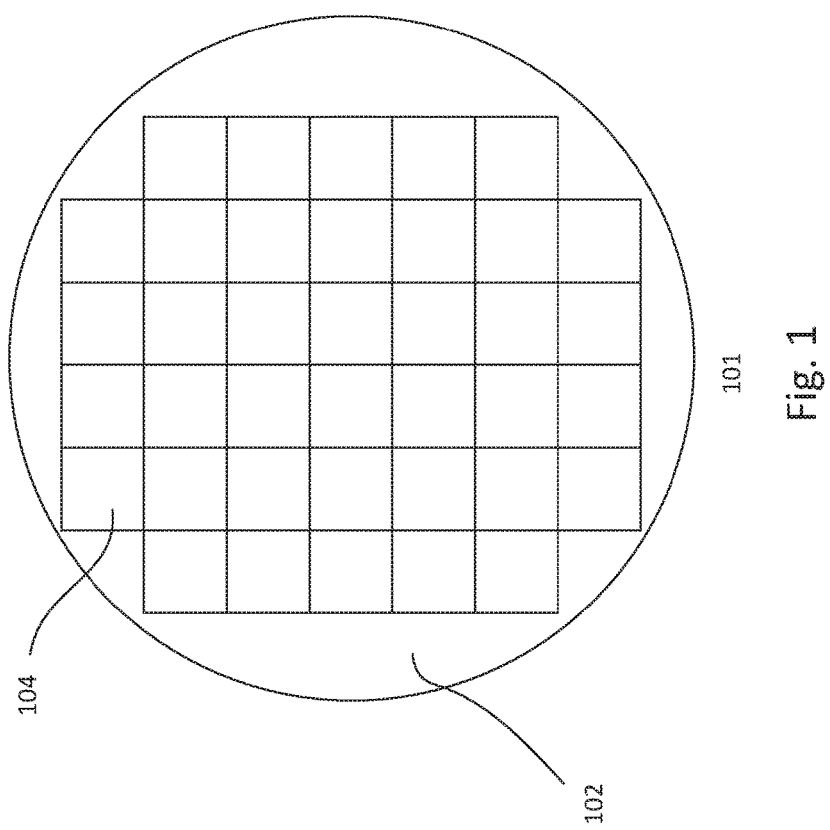

HIGH COUPLING RATIO SPLIT GATE MEMORY CELL

BACKGROUND

Fully depleted silicon-on-insulator (FDSOI) is a planar process technology that enables control of the behavior of transistors by polarizing the substrate underneath the device. This results in advantages of a reduced silicon geometries while simplifying the manufacturing process. Providing a high density solution to FDSOI such as coupling with split gate non-volatile memory (NVM) devices enables more efficient, reliable and re-programmable system at a low cost.

However, conventional split gate NVM devices utilizing FDSOI platform suffer several limitations, such as scalability issues or program disturbance. Further, there is also a desire to form split gate memory devices which can be integrated together with other types of devices to form embedded memory in a cost effective manner. As such, it is desirable to provide a split gate NVM cell with improved scalability, increased program/erase speed, minimized program disturbance and with improved endurance and a low cost methodology which can integrate logic and memory devices on the same chip.

SUMMARY

Embodiments of the present disclosure generally relate to semiconductor devices and the method of making thereof. In one embodiment, a split gate non-volatile memory (NVM) cell is formed on a crystalline-on-insulator (COI) substrate, such as a fully or partially depleted silicon-on-insulator (SOI) is disclosed. The split gate memory cell includes a split gate disposed on a surface substrate of the SOI substrate between source/drain (S/D) regions. The split gate includes a storage gate with a control gate (CG) over a floating gate (FG), and a select gate (SG). A back gate is provided on the bulk substrate below a buried oxide (BOX). The back gate may be doped with the same polarity type dopants as the S/D regions. The back gate is coupled to the CG to increase CG coupling ratio, improving programming performance. Alternatively, the back gate may be doped with the opposite polarity type dopants as the S/D regions. The back gate is coupled to a negative bias during program and erase operations. The negative bias increases the gate threshold voltages of the SG and CG, resulting in higher electron generation efficiency to improve programming speed as well as a higher electric field to increase erase speed.

In another embodiment, a method for forming a split gate NVM cell on a SOI substrate is disclosed. Forming the split gate memory cell includes forming a split gate disposed on a surface substrate of the SOI substrate between S/D regions. The split gate includes a storage gate with a CG over a FG, and a SG. The split gate NVM cell also includes forming a back gate on the bulk substrate below a BOX and coupled to the CG to increase CG coupling ratio, improving programming performance. The back gate may be doped with the same polarity type dopants as the S/D regions. Alternatively, the back gate may be doped with the opposite polarity type dopants as the S/D regions and coupled to a negative bias during program and erase operations. The negative bias increases the gate threshold voltages of the SG and CG, resulting in higher electron generation efficiency to improve programming speed as well as a higher electric field to increase erase speed.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIG. 1 shows a top view of a semiconductor wafer;

DETAILED DESCRIPTION

Embodiments generally relate to semiconductor devices and fabricating the semiconductor devices. Some embodiments relate to memory devices, such as non-volatile memory (NVM) devices. Such memory devices, for example, can be incorporated into standalone memory devices or easily integrated into logic processing technologies to form integrated circuits (ICs) without compromising the reliabilities of the different devices. Such ICs may be used in, for example, embedded flash technology or other types of technology. The ICs can be incorporated into or used with, for example, microcontrollers for automotive, communication systems, and for consumer products such as cell phones, memory cards, smart cards, internet of things (IOT), etc.

FIG. 1 shows a simplified plan view of an embodiment of a semiconductor wafer 101. The semiconductor wafer, for example, may be a crystalline-on-insulator (COI) wafer. The COI substrate may be a silicon-on-insulator (SOI) wafer. In one embodiment, the wafer is fully depleted SOI (FDSOI) with an ultra-thin buried oxide (UTBOX) insulator. For example, the FDSOI substrate includes a surface silicon wafer and a bulk silicon wafer separated by an UTBOX. Other types of wafers may also be useful. For example, the SOI wafer may be a partially depleted SOI (PDSOI) wafer.

The wafer includes an active surface 102 on which a device 104 is formed. A plurality of devices may be formed on the wafer in parallel. The devices, for example, are arranged in rows along a first (x) direction and columns along a second (y) direction. Separating the devices are dicing channels. After wafer processing is completed, the wafer is diced along the dicing channels to singulate the devices into individual chips.

Figure 2A:
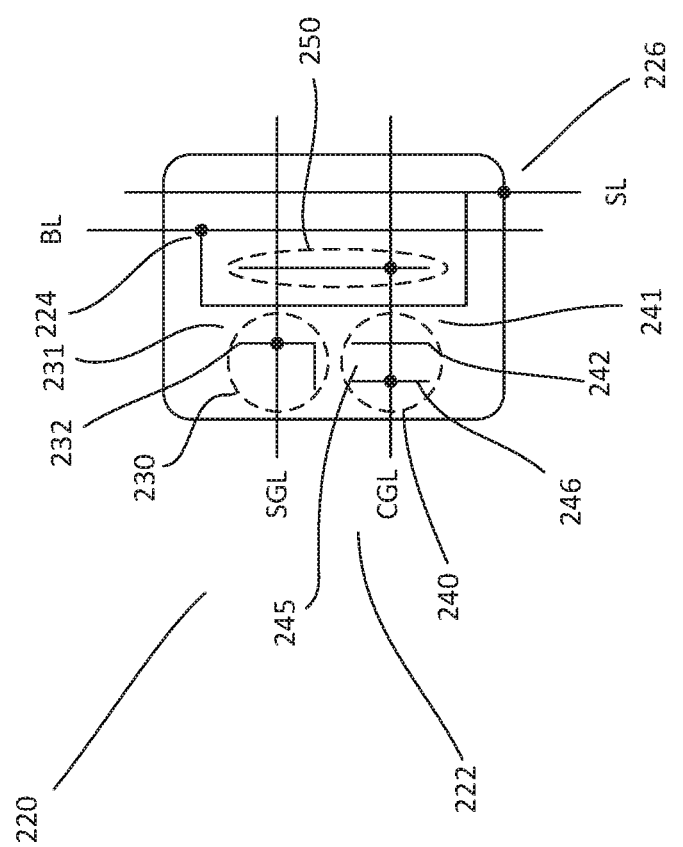
FIGS. 2a-2b show simplified schematics of various embodiments of a circuit diagram of a memory device.

FIG. 2a shows a simplified schematic of an embodiment illustrating a circuit diagram of a memory cell 200a. In one embodiment, the memory cell is a NVM cell. The NVM cell, for example, may be a complementary metal oxide semiconductor (CMOS) memory cell. The memory cell, in one embodiment, is formed on a COI substrate, such as a SOI substrate. In one embodiment, the memory cell is formed on a FDSOI substrate. Other types of substrates may also be useful. The SOI substrate includes a surface silicon substrate and a bulk silicon substrate separated by a buried oxide (BOX). The surface and bulk substrates may be doped. For example, the surface and bulk substrate may be lightly doped with p-type dopants. Doping the substrates with other types of dopants or dopant concentrations may also be useful.

In one embodiment, the NVM cell is a split gate NVM cell. The split gate NVM cell, for example, includes a split gate transistor 220. The split gate transistor includes a split gate 222 disposed between first and second cell terminals 224 and 226. The split gate includes first and second gates 230 and 240. The first gate serves as a select gate (SG) and the second gate serves as a storage gate. The SG includes a SG electrode 232 and a SG dielectric 231. The SG dielectric may be disposed on the surface substrate of the SOI substrate while the SG electrode is disposed on the SG dielectric. The SG dielectric may be thermal silicon oxide while the SG electrode may be polysilicon. Other types SG electrodes and SG dielectrics may also be useful. The SG electrode serves as a SG terminal of the memory cell.

As for the storage gate, it includes first and second storage gates. The second storage gate is disposed over the first storage gate. The second storage gate serves as a control gate (CG) and the first storage gate serves as a floating gate (FG). The CG includes a CG electrode 246 over a CG dielectric 245 while the FG includes a FG electrode 242 over a FG dielectric 241. The FG dielectric is disposed on the surface substrate of the SOI substrate while the FG electrode is disposed over the FG dielectric. The CG dielectric is disposed on the FG electrode and the CG electrode is disposed on the CG dielectric. The FG and CG electrodes may be polysilicon, the FG dielectric may be thermal silicon oxide while the CG dielectric may be an oxide/nitride/oxide (ONO) stack. The CG dielectric serves as a blocking oxide. For example, the CG dielectric prevents charge stored in the FG from migrating into the CG. Other types of electrodes and dielectrics may also be useful. The CG electrode serves as a CG terminal of the memory cell.

The first and second gates are adjacent gates. For example, a second sidewall of the SG is adjacent to a first sidewall of the storage gate. An intergate dielectric may be disposed between the SG and storage gate. The intergate dielectric may be a silicon oxide, such as high temperature oxide (HTO). Other types of intergate dielectric may also be useful.

The surface substrate serves as a body of the split gate transistor. The body below the gates serves as a channel of the transistor. The body, for example, includes second polarity type dopants for a first polarity type transistor. For example, the body may be doped with p-type dopants for a n-type transistor. Providing a n-type body for a p-type transistor may also be useful. The FG and SG dielectrics separate the FG and SG electrodes from the substrate or channel. In one embodiment, the body is an ultra-thin body.

The first cell terminal is disposed adjacent to the SG and the second cell terminal is disposed adjacent to the storage gate. For example, the first cell terminal is disposed adjacent to the first sidewall of the SG and the second cell terminal is disposed adjacent to the second sidewall of the storage gate. The terminals may be doped source/drain (S/D) regions in the surface. The S/D regions include first polarity dopants for a first polarity type transistor. For example, the S/D regions are n-type doped regions for a n-type transistor. Providing p-type S/D regions for a p-type transistor may also be useful. The first S/D region may be referred to as the drain region and serves as a drain terminal of the memory cell while the second S/D region may be referred to as the source or source region and serves as a source terminal of the memory cell.

In one embodiment, the memory cell includes a back gate 250. The back gate is disposed in the bulk substrate of the SOI substrate. For example, the back gate is disposed in a surface portion of the bulk substrate adjacent to the BOX. The back gate, in one embodiment, is a doped region in the surface portion of the bulk substrate. For example, the back gate is a heavily doped region in the surface portion of the bulk substrate adjacent to the BOX. For example, the back gate is a heavily doped well. In one embodiment, the back gate is a heavily doped first polarity well. The back gate may be a heavily doped n-type well for a n-type memory cell. The back gate serves as a back gate terminal of the memory cell. The back gate terminal is coupled to back gate bias voltage $V_{BG}$. As shown, the back gate terminal is coupled to the CG. For example, $V_{BG}$ is equal to the voltage at the CG.

The various terminals of the memory cell are coupled to different signal lines. In one embodiment, the CG terminal is coupled to a control gate line (CGL) and the SG terminal is coupled to a select gate line (SGL). The SGL may also be referred to as a wordline (WL). The source terminal is coupled to a source line (SL) and the drain terminal is connected to a bitline (BL). In one embodiment, the CGL and SGL are disposed in a first direction, such as a row direction, and the SL and BL are disposed in a second direction, such as a column direction. Other configurations of lines may also be useful.

Figure 2B:
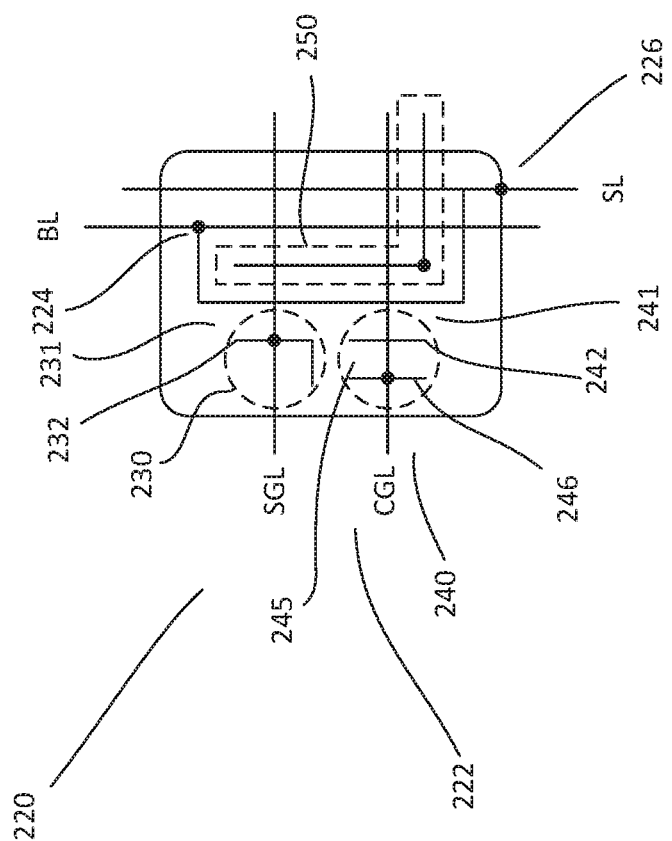

FIG. 2b shows a simplified schematic of another embodiment illustrating a circuit diagram of a memory cell 200b. The memory cell is similar to the memory cell 200a as described in FIG. 2a. In the interest of brevity, common elements may not be described or described in detail.

As shown, the memory cell is a NVM cell and includes a split gate transistor 220 with a SG 230 and a storage gate 240. The storage gate includes a CG disposed over a FG. The SG and storage gate are adjacent gates separated by an intergate dielectric.

In one embodiment, back gate 250 includes a heavily doped second polarity type doped well in a surface portion of the bulk substrate of the SOI substrate. For example, the back gate is a heavily doped p-type well for a n-type memory cell. The back gate serves as a back gate terminal of the memory cell. In one embodiment, the back gate terminal is coupled to back gate bias voltage ($V_{BG}$).

Figure 3A:
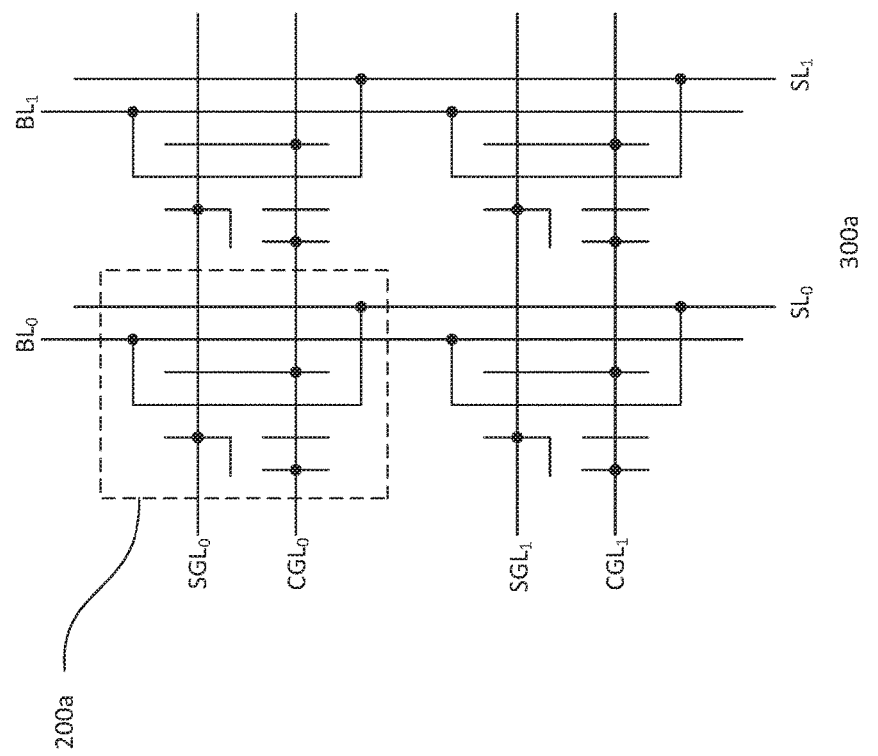
FIGS. 3a-3b show simplified schematics of various embodiments of a circuit diagram of a memory array.

FIG. 3a shows a simplified schematic of an embodiment illustrating a circuit diagram of a memory array 300a. In one embodiment, the memory array includes a NVM array with a plurality of NVM cells 200a, such as those described in FIG. 2a. Common elements may not be described or described in detail. A memory cell of the array includes a first polarity type back gate which is coupled to the CG. The memory cells are interconnected to form a Y×Z array. The row direction may be along a WL or SGL direction and the column direction may be along a BL direction. As shown, the array a 2×2 array with four memory cells interconnected by $SGL_0$, $CGL_0$, $SGL_1$ and $CGL_1$ in the row direction and $BL_0$, $SL_0$, $BL_1$ and $SL_1$ in the column direction. As shown, each column of memory cells is interconnected by its respective BL and SL and each row of memory cells is interconnected by its respective SGL and CGL. Other configurations of interconnecting the memory cells to form an array may also be useful.

Although the array is illustrated as a 2×2 array, it is understood that the array may have many more cells. For example, the NVM array may be 32×32 or 80×62 array.

Other sized arrays may also be useful. Furthermore, the array may be subdivided into blocks. Other configurations of the array may also be useful.

Memory accesses or operations, such as erase, program and read operations, are performed by providing appropriate bias voltages to the various terminals of the memory cells. Furthermore, the array may be configured to perform bulk accesses, such as erase accesses. Table 1 below shows various signals applied to the terminals of the memory cells (selected cells (sel.) and unselected cells (unsel.)) of the memory array for performing various types memory operations:

TABLE 1

|         | SGL    |        | BL     |        |
|---------|--------|--------|--------|--------|
|         | Sel.   | Unsel. | Sel.   | Unsel. |
| Erase   | 11.5 V | 0 V    | 0 V    | 0 V    |
| Read    | 2.5 V  | 0 V    | 0.8 V  | 0 V    |
| Program | 1 V    | 0 V    | 0 V    | 2.5 V  |

|         | SL     |        | CGL    |        |
|---------|--------|--------|--------|--------|
|         | Sel.   | Unsel. | Sel.   | Unsel. |
| Erase   | 0 V    | 0 V    | 0 V    | 0 V    |
| Read    | 0 V    | 0 V    | 2.5 V  | 0 V    |
| Program | 4.5 V  | 4.5 V  | 10.5 V | 2.5 V  |

The voltage values presented in Table 1 above are exemplary voltage values. It is understood that other suitable types of voltage values may also be useful, for example, depending on the technology node or design requirements.

Figure 3B:
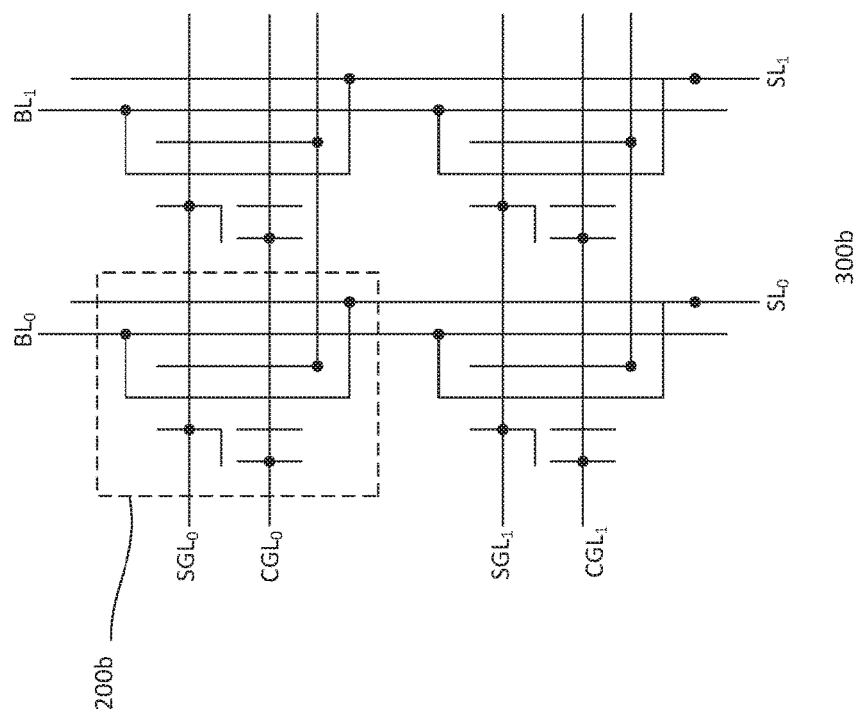

FIG. 3b shows a simplified schematic of an embodiment illustrating a circuit diagram of a memory array 300b. In one embodiment, the memory array includes a NVM array with a plurality of NVM cells 200b, such as those described in FIG. 2b. Common elements may not be described or described in detail. A memory cell of the array includes a second polarity type back gate which is coupled to a back gate bias VBP. The VBP may be commonly coupled to the memory cells of the array. The memory cells are interconnected to form a Y×Z array. The row direction may be along a WL or SGL direction and the column direction may be along a BL direction. As shown, the array a 2×2 array with four memory cells interconnected by $SGL_0$, $CGL_0$, $SGL_1$ and $CGL_1$ in the row direction and $BL_0$, $SL_0$, $BL_1$ and $SL_1$ in the column direction.

Although the array is illustrated as a 2×2 array, it is understood that the array may have many more cells. For example, the NVM array may be 32×32 or 80×62 array. Other sized arrays may also be useful. Furthermore, the array may be subdivided into blocks. Other configurations of the array may also be useful.

Memory accesses or operations, such as erase, program and read operations, are performed by providing appropriate bias voltages to the various terminals of the memory cells. Furthermore, the array may be configured to perform bulk accesses, such as erase accesses. Table 2 below shows various signals applied to the terminals of the memory cells (selected cells (sel.) and unselected cells (unsel.)) of the memory array for performing various types memory operations:

TABLE 2

|         | SGL    |        | BL     |        | SL     |        |
|---------|--------|--------|--------|--------|--------|--------|
|         | Sel.   | Unsel. | Sel.   | Unsel. | Sel.   | Unsel. |
| Erase   | 11.5 V | 0 V    | 0 V    | 0 V    | 0 V    | 0 V    |
| Read    | 2.5 V  | 0 V    | 0.8 V  | 0 V    | 0 V    | 0 V    |
| Program | 1 V    | 0 V    | 0 V    | 2.5 V  | 4.5 V  | 4.5 V  |

|         | CGL    |        | $V_{PW}$ |        |
|---------|--------|--------|--------|--------|
|         | Sel.   | Unsel. | Sel.   | Unsel. |
| Erase   | 0 V    | 0 V    | −2 V   | −2 V   |
| Read    | 2.5 V  | 0 V    | 0 V    | 0 V    |
| Program | 10.5 V | 2.5 V  | −2 V   | −2 V   |

The voltage values presented in Table 2 above are exemplary voltage values. It is understood that other suitable types of voltage values may also be useful, for example, depending on the technology node or design requirements.

Figure 4A:
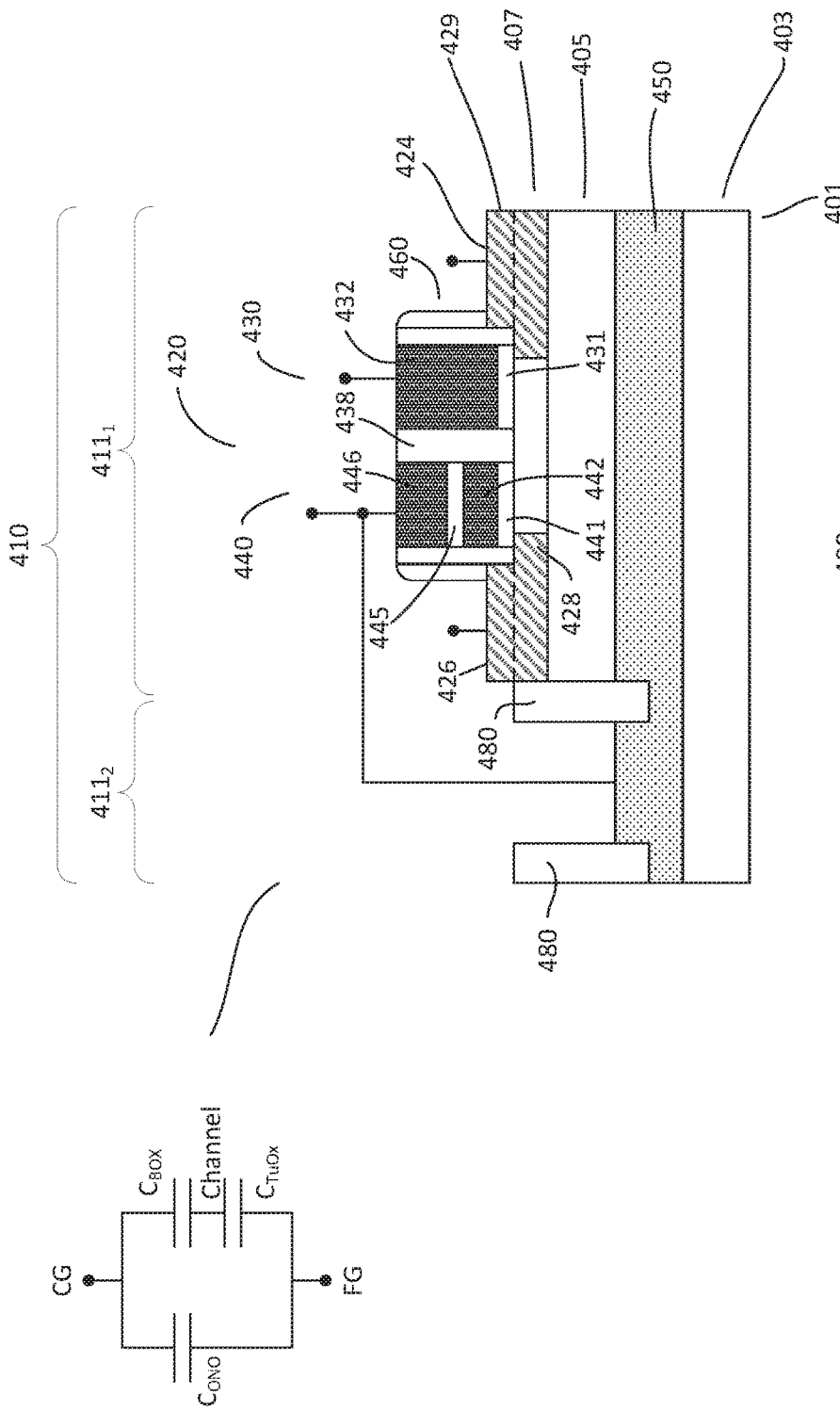
FIGS. 4a-4b show simplified cross-sectional views of various embodiments of a memory device.

FIG. 4a shows a cross-sectional view of an embodiment of a device 400a. The device includes a substrate 401. The substrate may be a COI substrate, such as a SOI substrate. In one embodiment, the substrate is a FDSOI substrate. Other types of substrates may also be useful. The SOI substrate includes a surface silicon substrate 407 and a bulk silicon substrate 403 separated by a buried oxide (BOX) 405. Other types of substrates may also be useful. The surface and bulk substrates may be doped. For example, the surface and bulk substrate may be lightly doped with p-type dopants. The dopant concentration of the substrates may be about 1E17-1E18 dopants/cm$^3$. Doping the substrates with other types of dopants or dopant concentrations may also be useful. As for the BOX, it may be a silicon oxide insulator. Other types of insulators may also be useful. In one embodiment, the surface substrate is an ultra-thin surface substrate having a thickness of about 5-10 nm and the BOX is an ultra-thin BOX (UTBOX) having a thickness of about 10-30 nm. Other thicknesses for the surface substrate and BOX may also be useful. The ultra-thin surface substrate serves as an ultra-thin body for the memory cell.

The substrate includes a device or cell region 410 with a memory cell. The memory cell may be a NVM cell, such as that described in FIGS. 2a and 3a. Common elements may not be described or described in detail. The device region may be part of an array region with plurality of memory cells interconnected to form an array. Providing a substrate prepared with other types of regions (not shown) may also be useful. For example, the substrate may include a logic region for support of other types of logic circuitry. The substrate may also include regions for other types of circuitry, depending on the types of device or IC. For example, the logic region may include sub-regions for high voltage (HV), intermediate voltage (IV) and low voltage (LV) devices.

The cell region 410, as shown, includes first and second cell sub-regions $411_{1-2}$. The first cell sub-region serves as a body for a split gate transistor 420 of the memory cell and the second sub-region has the surface substrate and BOX removed to expose the bulk substrate.

The substrate includes isolation regions 480. The isolation regions, for example, are shallow trench isolation (STI) regions. An isolation region extends at least a complete depth of the surface substrate. As shown, an isolation region extends through the surface substrate, BOX and into the bulk substrate. An isolation region may surround a device region, isolating it from other regions. In addition, an isolation region is provided to isolate the sub-regions of the cell region. In one embodiment, isolation regions may be provided to isolate cells in row and column directions as well as from other device regions. Other configurations of isolation regions may also be useful.

In one embodiment, the surface substrate in the cell region includes a doped device well having second polarity type dopants. The device well extends the thickness of the surface substrate in the device region. The second polarity type device well serves as a body for the first polarity type memory cell. For example, the second polarity type device well serves as a body for a first polarity type split gate transistor. In one embodiment, a p-type device well serves as a body for a n-type split gate transistor. Providing a n-type device well for a p-type split gate transistor may also be useful. P-type dopants may include boron (B), aluminum (Al), indium (In) or a combination thereof while n-type dopants may include phosphorus (P), arsenic (As), antimony (Sb) or a combination thereof.

The split gate NVM transistor includes a split gate disposed on the surface substrate in the first cell sub-region. The split gate is disposed between first and second cell terminals 424 and 426. The split gate includes first and second gates 430 and 440. The first gate serves as a select gate (SG) and the second gate serves as a storage gate. The SG includes a SG electrode 432 and a SG dielectric 431. The SG dielectric may be disposed on the surface substrate while the SG electrode is disposed on the SG dielectric. The SG dielectric may be thermal silicon oxide while the SG electrode may be polysilicon. Other types SG electrodes and SG dielectrics may also be useful. The SG electrode serves as a SG terminal of the memory cell. The thickness of the SG dielectric may be about 6 nm and the thickness of the SG electrode may be about 80 nm. Other thicknesses may also be useful.

As for the storage gate, it includes first and second storage gates. The second storage gate is disposed over the first storage gate. The second storage gate serves as a control gate (CG) and the first storage gate serves as a floating gate (FG). The CG includes a CG electrode 446 over a CG dielectric 445 while the FG includes a FG electrode 442 over a FG dielectric 441. The FG dielectric is disposed on the surface substrate of the SOI substrate while the FG electrode is disposed over the FG dielectric. The CG dielectric is disposed on the FG electrode and the CG electrode is disposed on the CG dielectric. The FG and CG electrodes may be polysilicon, the FG dielectric may be thermal silicon oxide while the FG dielectric may be an oxide-nitride-oxide (ONO) stack. The CG dielectric serves as a blocking oxide while the FG dielectric serves as a tunneling oxide. Other types of electrodes and dielectrics may also be useful. The CG electrode serves as a CG terminal of the memory cell.

The thickness of the CG electrode may be about 80 nm and the thickness of the CG dielectric may be about 12 nm; the thickness of the FG electrode may be about 80 nm and the FG electrode may be about 8 nm. Other thicknesses may also be useful. In addition, the first and second gates have the same height. Providing other configurations of the first and second gates may also be useful. In one embodiment, the gate electrodes may be doped to reduce or minimize gate electrode series resistance. For example, the gate electrodes may be doped with first polarity type dopants. The dopant concentration of the gate electrodes may be about 1E20 dopants/cm$^3$. Other dopant concentrations may also be useful.

The first and second gates are adjacent gates. For example, a second sidewall of the SG is adjacent to a first sidewall of the storage gate. An intergate dielectric 438 may be disposed between the SG and storage gate. The intergate dielectric may be a silicon oxide, such as high temperature oxide (HTO). Other types of intergate dielectric may also be useful.

As discussed, the split gate is disposed between first and second cell terminals. The first cell terminal is disposed adjacent to the SG and the second cell terminal is disposed adjacent to the storage gate. For example, the first cell terminal is disposed adjacent to a first sidewall of the SG and the second cell terminal is disposed adjacent to a second sidewall of the storage gate. The terminals may be doped source/drain (S/D) regions in the surface substrate. In one embodiment, the S/D regions are heavily doped S/D regions. For example, the dopant concentration of the S/D regions may be about 1E20 dopants/cm$^3$. Other dopant concentrations may also be useful. The S/D regions include first polarity dopants for a first polarity type transistor. For example, the S/D regions are n-type doped regions for a n-type transistor. Providing p-type S/D regions for a p-type transistor may also be useful. The first S/D region may be referred to as the drain region and serves as a drain terminal of the memory cell while the second S/D region may be referred to as the source or source region and serves as a source terminal of the memory cell.

In some embodiments, the S/D regions may be elevated S/D regions to reduce S/D series resistance. For example, in the case of a memory cell on a FDSOI substrate with an ultra-thin active region on a BOX, the S/D regions may be elevated S/D regions to reduce or minimize S/D series resistance. Elevated S/D regions include first or lower portions of the S/D regions disposed on the surface substrate and second or upper portions disposed on epitaxial layers 429 formed on the substrate. The lower and upper portions may be delineated by the dotted lines in the S/D regions.

The lower portion of a S/D region, in one embodiment, includes a heavily doped S/D region and a lightly doped (LD) extension region 428. The LD extension region is lightly doped with first polarity type dopants. The dopant concentration of the LD extension region is about 1E19 dopants/cm$^3$. Other dopant concentrations may also be useful. The LD extension region may sometimes be referred to as a lightly doped drain (LDD). As shown, the LD extension region extends under the gate. The lower portion of a S/D region extends from the top to the bottom of the surface substrate.

The non-adjacent sidewalls of the first and second gates are provided with dielectric sidewall spacers 460. For example, a first sidewall spacer is provided on a first side of the first gate of the split gate and a second sidewall spacer is provided on a second side of the second gate of the split gate. The sidewall spacers are employed to facilitate aligning the heavily doped S/D and LD extension regions. The spacers are composite spacers having multiple spacers. In one embodiment, a spacer may include first and second spacers. The first spacer is disposed on a sidewall of the gate and the second spacer is disposed on the first spacer. Other configurations of spacers may also be useful. A first spacer serves to facilitate forming an extension region while a second spacer serves to facilitate forming a heavily doped S/D region.

As discussed, the S/D regions may be elevated S/D regions with upper and lower portions to minimize S/D series resistance. In one embodiment, the epitaxial layers which serves as the upper portions of the S/D regions are formed after the first spacers are formed. For example, the elevated portions of the S/D regions are aligned with the first spacers. The second spacers are disposed on top of the upper portions of the elevated S/D regions. The upper portions are heavily doped with first polarity type dopants, similar to the heavily doped lower portions of the S/D regions. In other embodiment, the S/D regions may be non-elevated S/D regions. For example, the S/D regions may have a top surface with is coplanar with a surface of the substrate In one embodiment, the memory cell includes a back gate 450. The back gate is disposed in the bulk substrate of the SOI substrate. For example, the back gate is disposed in a surface portion of the bulk substrate adjacent to the BOX. The back gate, in one embodiment, is a doped region in the surface portion of the bulk substrate. For example, the back gate is a heavily doped region in the surface portion of the bulk adjacent to the BOX. For example, the back gate is a heavily doped well. In one embodiment, the back gate is a heavily doped first polarity well. The back gate may be a heavily doped n-type well for a n-type memory cell.

The back gate serves as a back gate terminal of the memory cell. The back gate is exposed, as already discussed, by removing the surface substrate and BOX in the second cell sub-region. The back gate terminal is coupled to back gate bias voltage ($V_{BG}$). As shown, the back gate terminal is coupled to CG terminal. For example, $V_{BG}$ is equal to the voltage at the CG. As shown, the second cell sub-region is disposed adjacent to the source terminal and is separated by an isolation region. Providing the second cell sub-region in other locations of the device region may also be useful. In some embodiments, the second cell sub-region may surround the first sub-cell region.

To lower contact resistance, the various terminals of the memory cell may be provided with metal silicide contacts (not shown). For example, metal silicide contacts may be provided on the S/D regions, SG electrode, CG electrode and exposed portion of the back gate. The metal silicide contact may be nickel-based silicide contacts, such as nickel (Ni) or nickel alloy. Other types of metal silicide contacts may also be useful.

The various terminals of the memory cell are coupled to different signal lines. In one embodiment, the CG terminal is coupled to a control gate line (CGL) and the SG terminal is coupled to a select gate line (SGL). The SGL may also be referred to as a wordline (WL). The source terminal is coupled to a source line (SL) and the drain terminal is connected to a bitline (BL). In one embodiment, the CGL and SGL are disposed in a first direction, such as a row direction, and the SL and BL are disposed in a second direction, such as a column direction. Other configurations of lines may also be useful.

In one embodiment, the signal or metal lines are disposed on a back-end-of-line (BEOL) dielectric. A BEOL dielectric is disposed on the substrate. For example, the BEOL covers the surface substrate, including memory cells and other devices in other device regions. The BEOL dielectric includes a plurality of interlayer dielectric (ILD) levels. An ILD level includes a metal level dielectric over a contact level dielectric. The metal and contact level dielectrics may be silicon oxide. For example, the silicon oxide may be tetraethyl orthosilicate (TEOS) formed by chemical vapor deposition (CVD). Providing low k dielectrics for the metal and contact level dielectrics or a combination of low k and IEOS dielectrics may also be useful. The BEOL dielectric may include dielectric etch stop liners between ILD levels or between metal level and contact level dielectrics. Other configurations of BEOL dielectrics may also be useful.

Generally, a metal level dielectric includes conductors or metal lines while the contact level dielectric includes via contacts. The conductors and contacts may be formed of a metal, such as copper (Cu), copper alloy, aluminum (Al), tungsten (W) or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

As discussed, the BEOL includes a plurality of ILD levels. For example, x number of ILD levels may be provided. In one embodiment, the device includes 8 ILD levels (x=8). Other numbers of ILD levels may also be useful. The numbers of ILD levels may depend on, for example, design requirement or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

In one embodiment, the CG terminal is coupled to a CGL and the SG terminal is coupled to a SGL. The SGL may also be referred to as a WL. The back gate terminal is coupled to the CGL. The source terminal is coupled to a SL and the drain terminal is connected to a BL. The various lines may interconnect memory cells to form an array. For example, CGLs, SGLs, BLs and SLs may interconnect memory cells in row and column direction to form a memory array.

In one embodiment, the CGL and SGL are disposed in a first direction, such as a row direction, and the SL and BL are disposed in a second direction, such as a column direction. Other configurations of lines may also be useful. Lines in the same direction may be disposed on the same metal level of the BEOL dielectric. For example, the CGL and SGL may be disposed on the same metal level and SL and BL may be disposed on another metal level. For example, CGL and SGL may be disposed on $M_1$ while SL and BL may be disposed on $M_2$. Other configurations of lines and metal levels may also be useful.

As described, the back gate is coupled to the CG. This increases CG coupling ratio, as illustrated by the capacitor model. Increased CG coupling ratio improves programming efficiency. Furthermore, lower access time is achieved due to the dual gate with better channel control and higher channel current, as well as improved endurance.

Figure 4B:
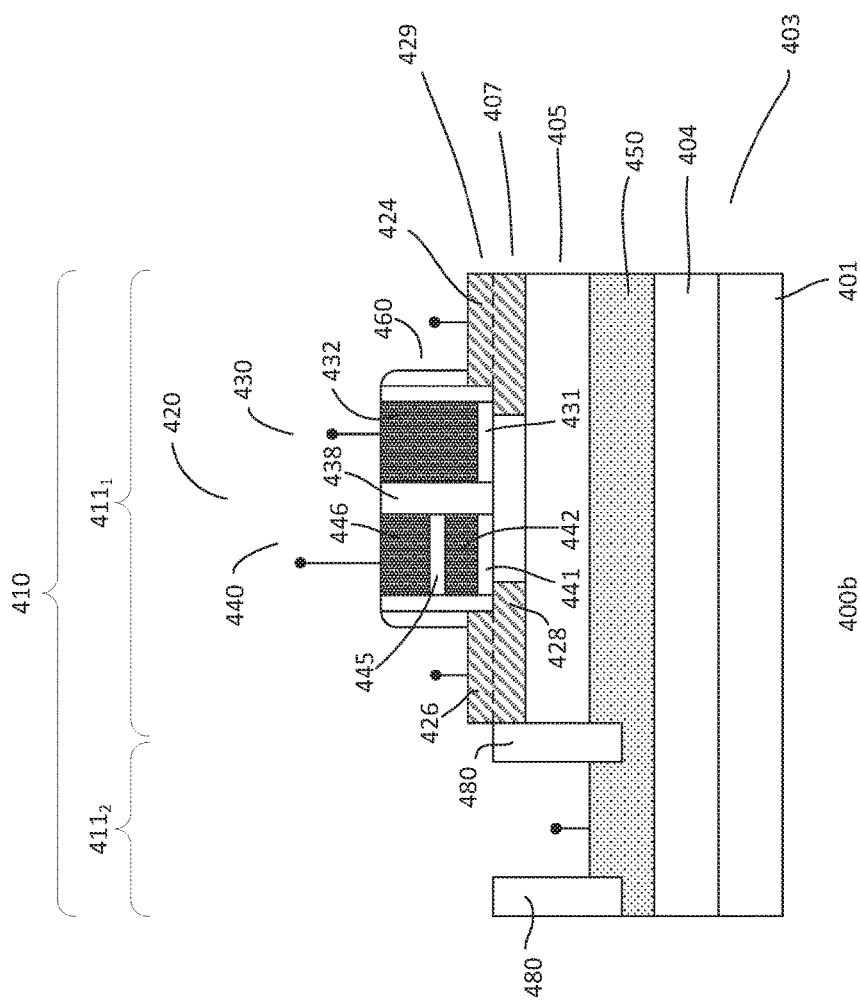

FIG. 4b shows a cross-sectional view of another embodiment of a device 400b. The device similar to the device of FIG. 4a. Common elements may not be described or described in detail. As shown, the device is the same as device of FIG. 4a except that the back gate 450. In one embodiment, the back gate is a heavily doped second polarity well. The back gate may be a heavily doped p-type well for a n-type memory cell.

The back gate serves as a back gate terminal of the memory cell. The back gate is exposed, as already discussed, by removing the surface substrate and BOX in the second cell sub-region. The back gate terminal is coupled to back gate bias voltage ($V_{BG}$). In one embodiment, the back gate bias is a common bias to all back gates of memory cells of the array. For example, the back gate may be a common back gate of all memory cells of the array.

The various terminals of the memory cell are coupled to different signal lines. In one embodiment, the CG terminal is coupled to a CGL and the SG terminal is coupled to a SGL. The SGL may also be referred to as a WL. The source terminal is coupled to a SL and the drain terminal is connected to a BL. In one embodiment, the CGL and SGL are disposed in a first direction, such as a row direction, and the SL and BL are disposed in a second direction, such as a column direction. Other configurations of lines may also be useful. In some embodiments, a hard mask, such as silicon nitride, may be disposed on the CG. The hard mask may include openings for contacting the CG. As for $V_{BG}$, it may be a common $V_{BG}$ to all back gates of memory cells of an array.

The back gate terminal enables a negative $V_{BG}$, such as −2V, to be selectively applied to the back gate during erase and programming operations. The negative $V_{BG}$ increases the gate threshold voltages $V_{TS}$ of the SG and CG, resulting in higher electron generation efficiency to improve programming speed as well as a higher electric field to increase erase speed. Furthermore, lower access time is achieved due to the dual gate with better channel control and higher channel current, as well as improved endurance.

FIGS. 5a-5f illustrate cross-sectional views of an embodiment of a process for forming a semiconductor device 400b. The process as will be described is highly compatible with complementary metal oxide semiconductor (CMOS) logic processing technology. The device formed, for example, is similar to that described in FIGS. 4a-b. Common elements and features may not be described or described in detail.

Figure 5A:
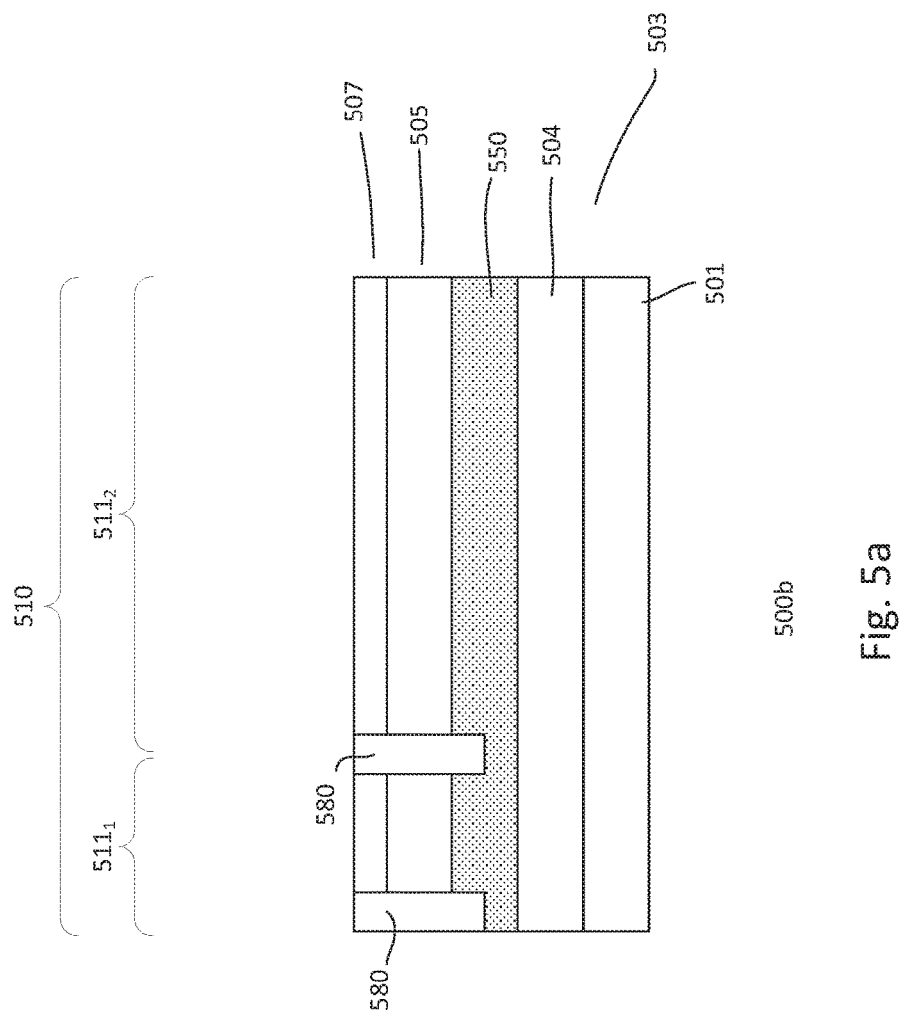
FIGS. 5a-5f show simplified cross-sectional views of an exemplary process for forming a device.

Referring to FIG. 5a, a substrate 501 is provided. The substrate may be a COI substrate, such as a SOI substrate. In one embodiment, the substrate is a FDSOI substrate. Other types of substrates or wafer may also be useful. The COI substrate includes a surface crystalline substrate 507 and a bulk crystalline substrate 503 separated by an insulator 505. In the case of a SOI substrate, the surface and bulk substrates may be silicon substrates. The insulator may be a BOX, such as silicon oxide. In one embodiment, the surface substrate may be an ultra-thin surface substrate having a thickness of about 5-10 nm and the BOX is an ultra-thin BOX (UTBOX) having a thickness of about 10-30 nm. Other thicknesses for the surface substrate and BOX may also be useful. The ultra-thin surface substrate serves as an ultra-thin body for a memory cell.

The substrate may be a doped substrate. For example, the substrate may be lightly doped with first type dopants. The first type dopants, for example, include p-type dopants, forming a lightly doped p-type substrate. Providing a substrate with other types of dopants or dopants concentrations, as well as undoped substrate, may also be useful. For example, the substrate may be doped with second type dopants, such as n-type dopants and/or other dopant concentrations, including intrinsically doped substrates.

The substrate may be prepared with a cell region 510. In one embodiment, the cell region, as shown, includes first and second cell sub-regions $511_{1-2}$. The cell region, for example, is a part of an array region with a plurality of cell regions on which memory cells are formed to create a memory array. Providing a substrate prepared with other types of regions (not shown) may also be useful. For example, the substrate may include a logic region for support of other types of logic circuitry. The substrate may also include regions for other types of circuitry, depending on the type of device or IC. For example, the logic region may include sub-regions for high voltage (HV), intermediate voltage (IV) and low voltage (LV) devices.

As shown, the substrate includes isolation regions 580 to isolate active device regions from other active device regions. The isolation regions extend at least a complete depth of the surface substrate. As shown, an isolation region extends through the surface substrate and into the bulk substrate. The isolation regions, for example, are STI regions. Various processes may be employed to form the STI regions. For example, the substrate can be etched using etch and mask techniques to form trenches which are then filled with dielectric materials such as silicon oxide. Chemical mechanical polishing (CMP) may be performed to remove excess oxide and provide a planar substrate top surface. The STI regions may be formed, for example, prior to or after the formation of the doped wells. Other processes can also be used to form the STIs. Other types of isolation regions are also useful.

The device region is prepared with a back gate 550. The back gate is disposed in the bulk substrate of the SOI substrate. For example, the back gate is disposed in a surface portion of the bulk substrate adjacent to the BOX. The back gate, in one embodiment, is a doped region in the surface portion of the bulk substrate. For example, the back gate is a heavily doped region in the surface portion of the bulk adjacent to the BOX. In one embodiment, the back gate is a heavily doped well. In one embodiment, the back gate is a heavily doped first polarity well. The back gate may be a heavily doped n-type well for a n-type memory cell. In other embodiments, the back gate is a heavily doped second polarity type well. For example, the back gate may be a heavily doped p-type well for a n-type memory cell.

The cell region may be prepared to include an isolation well 504. The isolation well, for example, is the opposite polarity type as the doped bulk substrate. For example, in the case of a p-type doped bulk substrate, the isolation well is a n-type well. The isolation well isolates the back gate from the bulk substrate. In the case that the back gate is doped with the opposite polarity type dopants as the bulk substrate, an isolation well may not be prepared in the bulk substrate. The isolation well may be lightly, intermediately or heavily doped. The isolation well may be a common isolation well for memory cells of the array region. The isolation well has a depth greater than the back gate. The back gate may be formed after forming the isolation well.

The different wells may be formed using different implant processes. For example, different polarity wells may be formed using different implant processes. An implant may be performed using a patterned resist mask. Patterning the resist layer may be achieved by exposing it to an exposure source using a reticle with the desired pattern. The pattern of the reticle is transferred to the exposed resist layer which then serves as an implant mask. Also, different depth wells may be separately formed using separate implant processes with separate implant masks. In addition, in the case of deeper wells, multiple implants may be performed. Generally, the deep well is performed prior to forming the other shallower wells. Other process flows for forming the wells may also be useful.

Figure 5B:
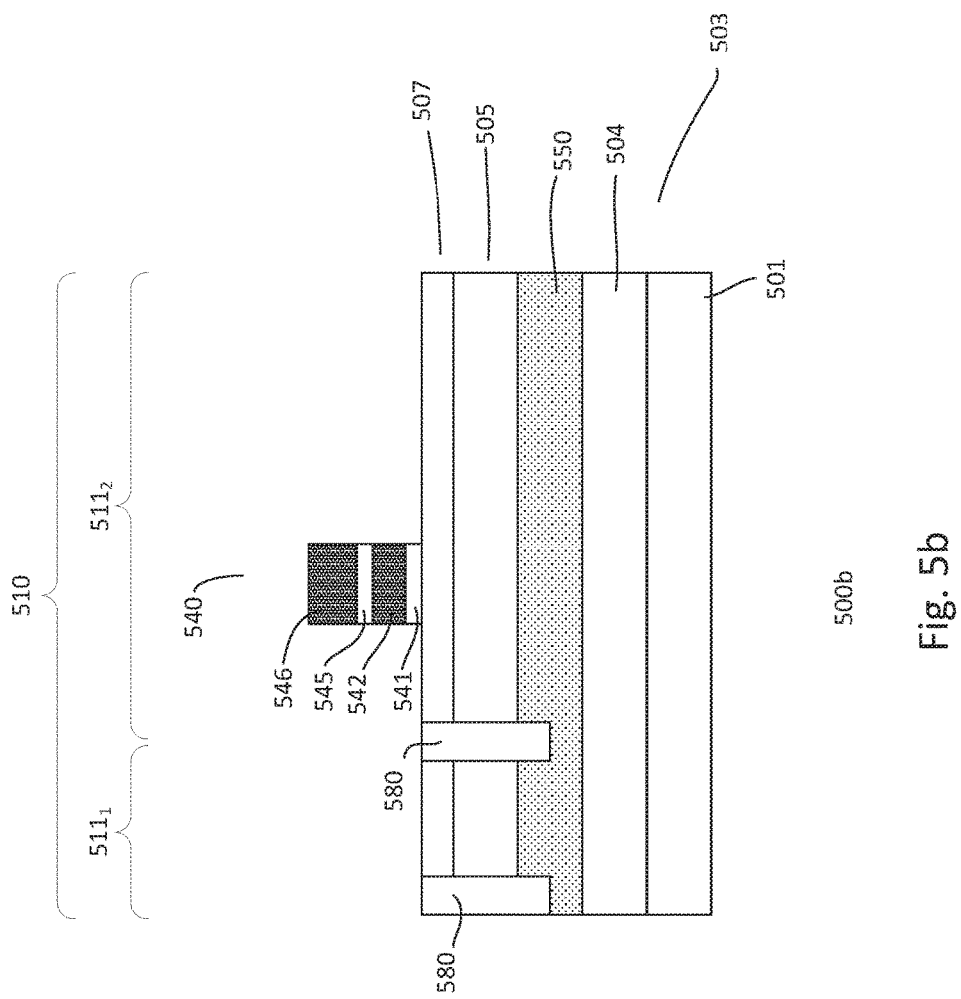

Referring to FIG. 5b, the process for forming the device continues with the formation of a storage gate 540. For example, the various layers of the storage gate may be sequentially formed on the substrate. In one embodiment, FG dielectric layer 541, FG electrode layer 542, CG dielectric layer 545 and CG electrode layer 546 are sequentially formed on the substrate. The FG dielectric may be a thermal silicon oxide layer, the FG dielectric may be a polysilicon layer formed by CVD, the CG dielectric may be a ONO stack and the CG electrode may be a polysilicon layer formed by CVD. The electrode layers may be doped with first polarity type dopants. Doping the electrode layers may be achieved by ion implantation or by in-situ doping. As for the ONO stack, if may include HTO and nitride formed by CVD. Other types of storage gate layers of forming techniques may also be useful.

The various layers may be patterned to form a storage gate. Patterning the gate layers may be achieved using mask and etch techniques. For example, a resist mask is patterned to serve as an etch mask. Patterning the resist mask may include exposing it with an exposure source with a reticle having the desired pattern. To improve lithographic resolution, an anti-reflective coating (ARC) may be provided below the resist layer. After exposure, the pattern of the reticle is transferred to the resist layer and the resist is developed. An anisotropic etch, such as a reactive ion etch (RIE), is employed to transfer the pattern of the resist mask to the gate layers, forming the storage gate. In other embodiments, a hard mask, such as a nitride hard mask, may be employed to pattern the gate layers. The hard mask is patterned using mask and etch techniques. The patterned hard mask is used to etch the gate layers to form the storage gate. Other techniques for forming the storage gate may also be useful. In the case of a hard mask, portions may be selectively etched to expose the electrode in the contact opening regions. The storage gate may be storage gate conductor, serving as a common storage gate for a row of memory cells.

Figure 5C:
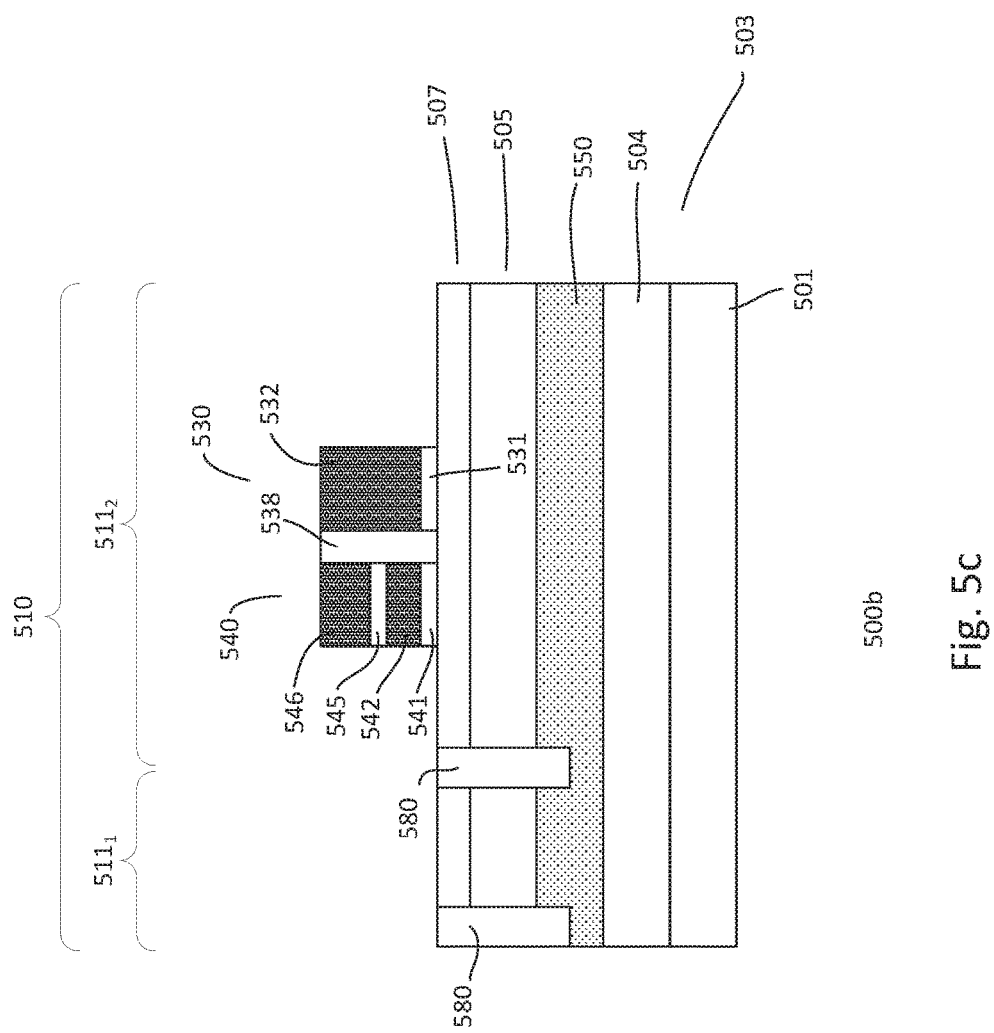

Referring to FIG. 5c, an intergate dielectric layer 538 is formed on a first sidewall of the storage gate. The intergate dielectric layer, in one embodiment, is a HTO layer. Other types of intergate dielectric layers may also be useful. To form the intergate dielectric, a HTO layer may be formed by, for example, CVD. The HTO lines the storage gate and substrate. An anisotropic etch, such as RIE, is performed to form dielectric spacers on the sidewalls of the storage gate. A mask, such as a resist mask, may protect the spacer on the first sidewall of the storage gate proximate to the drain region while leaving the spacer exposed on the second sidewall adjacent to the source region. A wet etch is performed to remove the exposed spacer on the second sidewall of the storage gate. After the wet etch, the mask is removed, exposing the intergate dielectric on the first storage gate sidewall.

The process continues to form a SG 530. The SG includes a SG electrode 532 over a SG dielectric 531. The SG dielectric, in one embodiment, is a thermal oxide while the SG electrode is a polysilicon formed by CVD. For example, a thermal oxide layer is formed on the substrate followed by forming a polysilicon layer on the substrate. The SG electrode layer may be doped with first polarity type dopants, such as by ion implantation or by in-situ doping. The substrate may be planarized by, for example, chemical mechanical polishing (CMP). The SG electrode and SG dielectric are patterned using mask and etch technique to form a SG adjacent to the CG. The storage gate and SG separated by the intergate dielectric form a split gate. The split gate, for example, is a split gate conductor which serves as a common split gate for a row of memory cells.

Figure 5D:
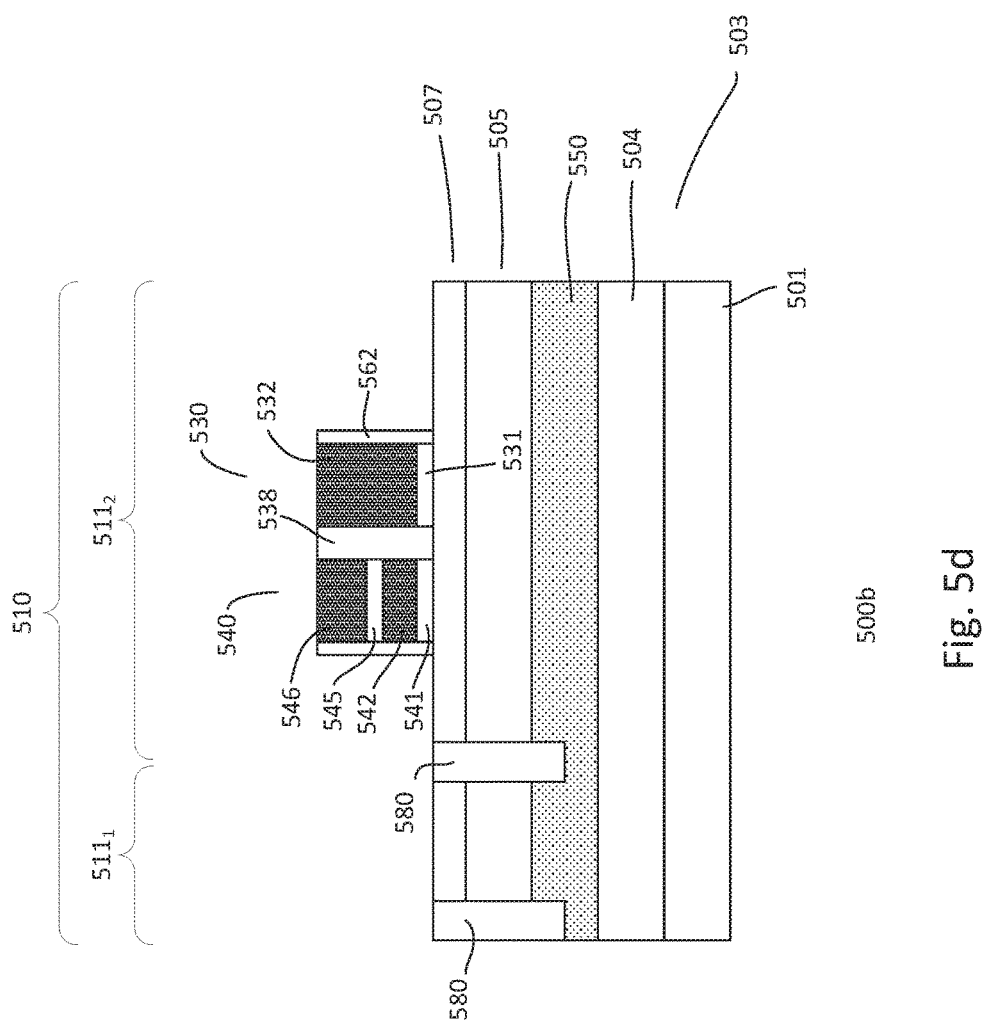

Referring to FIG. 5d, first dielectric spacers 562 are formed on sidewalls of the split gate. The dielectric spacers, for example, may be silicon oxide spacers. The spacers may include other types of spacers, such as silicon nitride spacers. In other embodiments, the spacer may be a composite spacer having multiple dielectric layers. For example, the composite spacer may include silicon oxide and silicon nitride layers. To form the first dielectric spacers, a dielectric spacer layer may be formed on the substrate by, for example, CVD. An anisotropic etch, such as RIE may be performed to remove horizontal portions of the spacer layer, leaving spacers on sidewalls of the split gate.

Figure 5E:
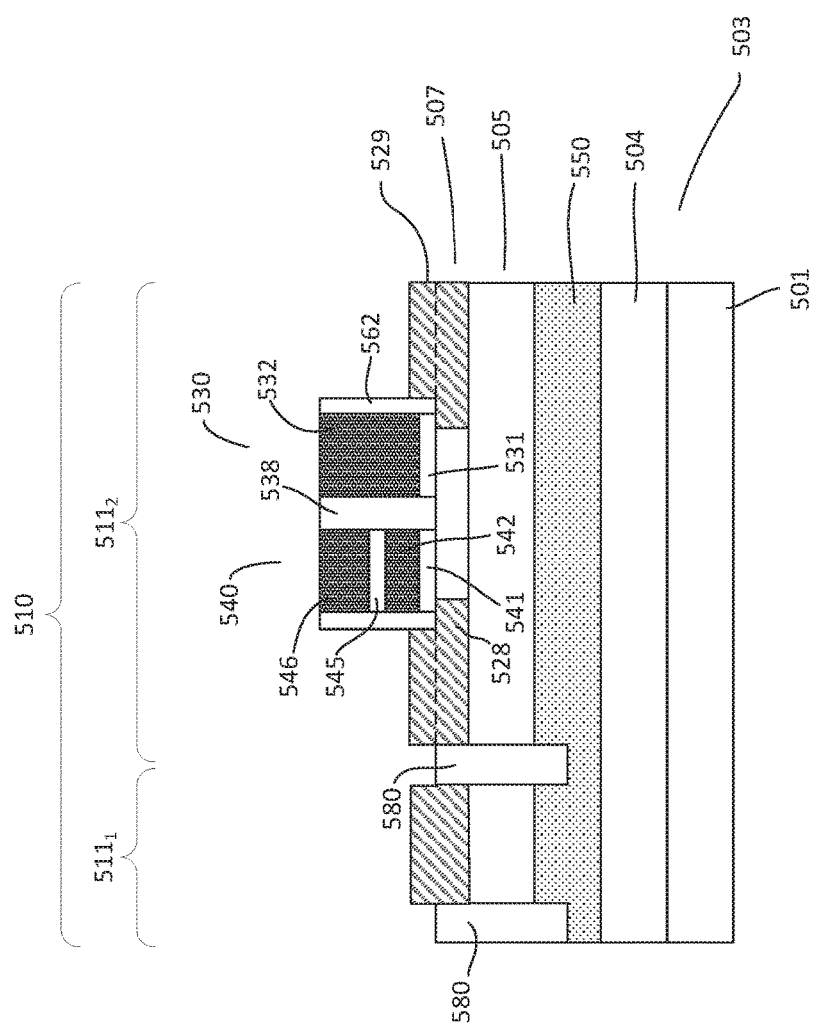

Referring to FIG. 5e, elevated S/D regions 529 are formed on the substrate. In one embodiment, elevated S/D regions are formed by selective epitaxial growth (SEG). The SEG forms epitaxial layers on, for example, exposed silicon surface of the substrate. As shown, an epitaxial layer also forms on exposed surface in the second cell sub-region.

After SEG, an implant is performed to form first polarity type LD extension regions 528 in the first and second S/D regions. The implant may be an angled implant, forming LD extension regions which extend under the gate. An implant mask may be used for the implant. The implant mask, for example, exposes the cell region. As such, the elevated region in the second sub-region may also be doped. The implant mask is removed after the implant.

Figure 5F:
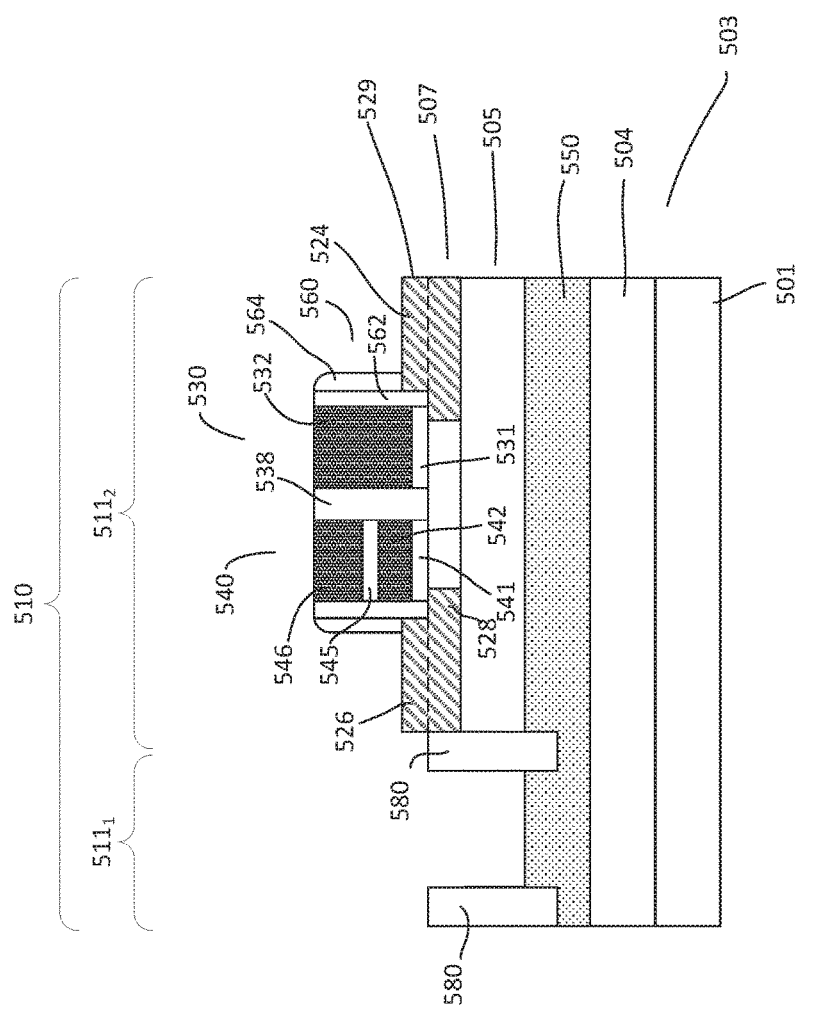

In FIG. 5f, second dielectric spacers 564 are formed on the first spacers. The second dielectric spacers may be formed of similar dielectric material as the first dielectric spacers. For example, the second spacers may be silicon oxide spacers or a composite spacers with silicon oxide and silicon nitride layers. Other types of dielectric spacers may also be useful. To form the second dielectric spacers, a second spacer layer is formed on the substrate and etched by, for example, RIE. The etch removes horizontal portions of the second spacer layer, leaving second dielectric spacers on the split gate sidewalls over the first dielectric spacers.

An implant is performed to form first polarity type heavily doped first and second S/D regions adjacent to the first and second sidewalls of the split gate. The implant, for example, is a vertical implant using an implant mask, similar to the one used to form the LD extension regions. Other types of implants may also be useful. The implant mask is removed after the implant. The first and second S/D regions serve as first and second cell terminals.

The surface substrate in the second cell sub-region is removed to expose the back gate 550. A RIE using an etch mask which exposes the second cell sub-region is used to remove the surface substrate to expose the back gate. Since the back gate is already heavily doped, there is no need to dope it to form a tap.

The process continues to complete forming the device. An anneal may be performed to activate the dopants, followed by forming metal silicide contacts on terminals of the memory cell. The metal silicide contacts, for example, may be nickel based silicide contacts. To form the silicide contacts, a metal layer is deposited on the substrate and annealed to cause a reaction with the exposed silicon substrate. This forms metal silicide contacts. Unreacted metal is removed by, for example, a wet etch.

Back-end-of-line (BEOL) processes may be performed to form BEOL dielectric with a plurality of ILD levels, as previously discussed, to form interconnections to the terminals of the memory cell. Additional processes are performed to complete the IC. These processes include, for example, final passivation, dicing and packaging.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A non-volatile memory (NVM) cell, comprising
a substrate, the substrate including a surface substrate and a bulk substrate separated by an insulator layer;
a split gate transistor disposed on the substrate, the split gate transistor including a first gate and a second gate separated by an intergate dielectric; and
a back gate in a surface portion of the bulk substrate adjacent to the insulator layer, the back gate serving as a back gate terminal of the NVM cell and coupled to back gate bias voltage ($V_{BG}$).

2. The device of claim 1, wherein the insulator layer is an ultra-thin buried oxide (UTBOX).

3. The device of claim 2, wherein the first gate serves as a storage gate and includes a first storage gate disposed underneath a second storage gate.

4. The device of claim 3, wherein the first storage gate is a floating gate (FG) and the second storage gate is a control gate (CG), the FG includes a FG electrode disposed over a FG dielectric, and the CG includes a CG electrode disposed over a CG dielectric.

5. The device of claim 4, wherein the CG dielectric is an oxide-nitride-oxide (ONO) stack.

6. The device of claim 3, wherein the second gate serves as a select gate (SG), and the SG includes a SG electrode disposed over a SG dielectric.

7. The device of claim 6, wherein the bulk substrate includes an isolation well which isolates the back gate from the bulk substrate and has a greater depth than the back gate.

8. A method of forming a non-volatile memory (NVM) cell, comprising:
providing a substrate, the substrate includes a surface substrate and a bulk substrate separated by an insulator layer;
forming a split gate transistor disposed on the substrate, wherein forming the split gate transistor includes forming a first gate adjacent to a second gate and separated by an intergate dielectric; and
forming a back gate in a surface portion of the bulk substrate adjacent to the insulator layer, wherein the back gate serves as a back gate terminal of the NVM cell and is coupled to back gate bias voltage ($V_{BG}$).

9. The method of claim 8, wherein the insulator layer is an ultra-thin buried oxide (UTBOX).

10. The method of claim 9, wherein the first gate serves as a storage gate, and forming the first gate includes disposing a second storage gate over a first storage gate, the first storage gate serves as a floating gate (FG), and the second storage gate serves as a control gate (CG).

11. The method of claim 10, wherein forming the FG includes disposing a FG electrode over a FG dielectric, and forming the CG includes disposing a CG electrode over a CG dielectric.

12. The method of claim 11, wherein the CG dielectric is an oxide-nitride-oxide (ONO) stack.

13. The method of claim 10, wherein the second gate serves as a select gate (SG), and forming the SG includes disposing a SG electrode over a SG dielectric.

14. The method of claim 13, wherein the bulk substrate includes an isolation well which isolates the back gate from the bulk substrate and has a greater depth than the back gate.

15. A device comprising:
a substrate, the substrate includes a surface substrate and a bulk substrate separated by an insulator layer;
a plurality of non-volatile memory (NVM) cells on and in the substrate, the NVM cells interconnected in a row direction and a column direction to form a memory array with rows and columns of the NVM cells, wherein each of the NVM cell includes:
a split gate transistor disposed on the substrate, the split gate transistor disposed between first and second source/drain (S/D) regions, wherein the split gate transistor includes a select gate (SG) and a storage gate separated by an intergate dielectric, and
a back gate in a surface portion of the bulk substrate adjacent to the insulator layer, wherein the back gate serves as a back gate terminal of the NVM cells and is coupled to back gate bias voltage ($V_{BG}$);
the NVM cells od each row are interconnected by a control gate line (CGL) coupled to control gate (CG) terminals of a respective row of the NVM cells and a select gate line (SGL) coupled to select gate (SG) terminals of a respective row of the NVM cells; and
the NVM cells of each column are interconnected by a source line (SL) coupled to source terminals of a respective column of the NVM cells and a bitline (BL) coupled to drain terminals of a respective column of the NVM cells.

16. The device of claim 15, wherein the storage gate comprises:
a floating gate (FG), the FG including a FG electrode disposed over a FG dielectric; and
a CG, the CG including a CG electrode disposed over a CG dielectric, and wherein the CG is disposed over the FG, and the CG electrode serves as the CG terminal.

17. The device of claim 16, wherein the SG comprises a SG electrode disposed over a SG dielectric, and the SG electrode serves as the SG terminal.

18. The device of claim 15, wherein the first S/D region is a drain region and serves as a drain terminal, and the second S/D region is a source region and serves as a source terminal.

19. The device of claim 15, wherein the bulk substrate comprises an isolation well which isolates the back gate from the bulk substrate and has a greater depth than the back gate.

20. A device comprising:
a plurality of non-volatile memory (NVM) cells, wherein the NVM cells are interconnected in a row direction and a column direction to form a memory array with rows and columns of the NVM cells, and wherein the NVM cells are disposed in and on a substrate, the substrate includes a surface substrate and a bulk substrate separated by an insulator layer;
the NVM cells of each row are interconnected by a control gate line (CGL) coupled to control gate (CG) terminals of a respective row of the NVM cells and a select gate line (SGL) coupled to select gate (SG) terminals of a respective row of the NVM cells;
the NVM cells of each column are interconnected by a source line (SL) coupled to source terminals of a respective column of the NVM cells and a bitline (BL) coupled to drain terminals of a respective column of the NVM cells; and
each of the NVM cells includes a back gate coupled to its respective CGL.

21. The device of claim 20, wherein the insulator layer comprises an ultra-thin buried oxide (UTBOX).

22. The device of claim 20, wherein the back gate of each of the NVM cells comprises a doped well that is disposed in the bulk substrate.

23. The device of claim 22, wherein the back gate of each of the NVM cells in the row direction are commonly coupled to the CGL of the row.

\* \* \* \* \*

UNITED STATES PATENT AND TRADEMARK OFFICE
CERTIFICATE OF CORRECTION

PATENT NO. : 10,276,582 B2
APPLICATION NO. : 15/681442
DATED : April 30, 2019
INVENTOR(S) : Yuan Sun et al.

Page 1 of 1

It is certified that error appears in the above-identified patent and that said Letters Patent is hereby corrected as shown below:

In the Claims

Column 16, Claim 15, Line 13, change "od" to --of--

Signed and Sealed this
Eighteenth Day of June, 2019

Andrei Iancu
*Director of the United States Patent and Trademark Office*